United States Patent [19]

Taylor et al.

[11] 3,941,759

[45] Mar. 2, 1976

[54] DEGRADABLE PLASTICS CONTAINING DUAL-FUNCTION ADDITIVE SYSTEM

[75] Inventors: Lynn J. Taylor, Toledo; John W. Tobias, Perrysburg, both of Ohio

[73] Assignee: Owens-Illinois, Inc., Toledo, Ohio

[22] Filed: Oct. 23, 1973

[21] Appl. No.: 408,336

Related U.S. Application Data

[63] Continuation-in-part of Ser. Nos. 230,969, March 1, 1972, and Ser. No. 301,199, Oct. 26, 1972, and Ser. No. 206,144, Dec. 8, 1971, Pat. No. 3,797,690.

[52] U.S. Cl.... 260/92.8 A; 260/94.9 GC; 260/93.7; 260/DIG. 43
[51] Int. Cl.² .......................... C08F 8/50; C08J 3/00
[58] Field of Search.... 260/45.75 R, DIG. 43, 23 H, 260/23 XA, 94.9 GC, 92.8 A, 93.7

[56] References Cited
UNITED STATES PATENTS 3,797,690    3/1974    Taylor et al. ..................... 260/23
3,825,627    7/1974    McGaugh ..................... 260/DIG. 43

FOREIGN PATENTS OR APPLICATIONS
770,202    7/1971    Belgium

OTHER PUBLICATIONS

Plastics Technology–July 1971, pp. 23, 26, 28.
Chemical Abstracts–79359j.

*Primary Examiner*—V. P. Hoke
*Attorney, Agent, or Firm*—Donald Keith Wedding

[57] ABSTRACT

There is disclosed a photoresistive plastic composition degradable by ultraviolet radiation, the composition comprising an organic polymeric material having dispersed therein a degradation controlling amount of an additive system consisting essentially of at least one organic photosensitizer and at least one organic derivative of a transition metal.

8 Claims, No Drawings

DEGRADABLE PLASTICS CONTAINING DUAL-FUNCTION ADDITIVE SYSTEM

RELATED APPLICATIONS

This is a continuation-in-part of copending U.S. Pat. applications Ser. No. 230,969, filed Mar. 1, 1972, Ser. No. 301,199, filed Oct. 26, 1972 and Ser. No. 206,144, filed Dec. 8, 1971, now U.S. Pat. NO. 3,797,690.

RELEVANT PRIOR ART

Chemical Abstracts, Volume 78, 73161y, (1973).

BACKGROUND OF THE INVENTION

This invention relates to plastic compositions containing additives which render the composition degradable by ultraviolet radiation.

The advent of plastics has given rise to improved methods of packaging goods. For example, polyethylene and polypropylene plastic films, bags, bottles, styrofoam cups and blister packages have the advantages of being chemically resistant, relatively unbreakable, light in weight and translucent or transparent. The increasing use of plastics in packaging applications has created a serious waste disposal problem. Burning of these plastic materials is expensive and may add to air pollution problems.

Unlike some other packaging materials, such as paper and cardboard, plastics are not readily destroyed by the elements of nature. Thus, burying them is not an effective means of disposal and can be expensive.

Plastics are biologically recent developments, and hence are not easily degradable by micro-organisms which attack most other forms of organic matter and return them to the biological life cycle. It has been estimated that it may take millions of years for organisms to evolve which are capable of performing this function. In the meantime, plastic containers and packaging films are beginning to litter the countryside after being discarded by careless individuals.

One means suggested for combating the plastic waste disposal problem has been the use of plastic compositions which degrade upon exposure to ultraviolet light. This approach would take advantage of the natural tendency of most organic polymers to undergo gradual reaction with atmospheric oxygen, particularly in the presence of light. Typically, a photosensitizing additive is employed in order to accentuate this natural tendency. The photosensitizing additive absorbs ultraviolet light (e.g., from sunlight); the additive, in the resulting photo-excited state, undergoes a chemical reaction which leads to the generation of free radicals which initiate an autoxidation process thereby leading to the eventual disintegration of the plastic material.

In the course of our investigations of the effect of sensitizing additives on the photodegradation of common thermoplastics, we have discovered that organic photosensitizers such as aromatic ketones and anthraquinone derivatives are quite effective in promoting rapid initiation of photo-oxidative degradation. However, as the reaction proceeds, the rate tends to decrease, presumably as the result of the chemical conversion of the sensitizer to a less effective compound or mixture of compounds.

Organic derivatives of transition metals, such as transition metal acetylacetonates and transition-metal salts of fatty acids, also function as effective accelerators of the photo-oxidative degradation of plastics. However, the utility of such materials as degradation-promoting additives is limited, owing to a tendency to cause thermal oxidation of plastics during high-temperature processing (e.g., fabrication of shaped articles by molding or extrusion); the coloration imparted to plastics by such additives; and the potential toxicity of such additives. Consequently, such additives must be employed in very low concentrations, if at all.

In contrast to other organic derivatives of transition metals, the dialkyldithiocarbamates such as ferric dimethyldithiocarbamate tend to act not only as sensitizers of photo-oxidative degradation, but also as retarders of thermal-oxidative degradation. When employed at low concentrations, such additives also display an "induction period" in photo-oxidative degradation; that is, degradation starts only after a certain delay, during which no appreciable degradation takes place. Once the degradation has started, the process is auto-accelerating, i.e., the degradation rate increases as exposure time increases. While the "induction period" feature is sometimes advantageous in the sense that undesired degradation due to accidental short-term exposure to light is avoided, it is disadvantageous in other instances, e.g., in cases where the lifetime of a discarded plastic article must be kept to a minimum or in cases where plastic wastes receive only a minimal exposure to light prior to earth burial, i.e., as in a land fill.

The present invention provides a route to degradable plastic compositions which display both the rapid initiation of photo-oxidation characteristic of compositions containing organic photosensitizers and the continuing, auto-accelearating degradation process which is characteristic of compositions containing organic derivatives of transition metals. In the practice of this invention a composition containing both an organic photosensitizer and an organic derivative of a transition metal is employed; the organic photosensitizer causes rapid initiation of the degradation process whereas the use of the transition-metal compound provides for a rapid, continuing photo-oxidation process, which is typically auto-accelerating. Furthermore, selected compositions display a "synergistic effect", in that the degradation-promoting effect of the combination of additives is greater than that which would be expected on the basis of the effect of each additive when used alone.

The practice of the present invention also provides a route to compositions which gradually oxidize in the dark after an initial short-term exposure to ultraviolet light. We believe that this unexpected but highly desirable result is due to the rapid build-up of hydroperoxide groups during the photochemical initiation phase, followed by a slower thermal oxidation process caused by metal-catalyzed decomposition of these hydroperoxide groups.

DESCRIPTION OF THE INVENTION

In accordance with this invention, a degradable plastic composition is prepared by the admixture of an organic polymeric material and a degradation-controlling additive system, the system consisting essentially of at least one organic photosensitizer and at least one organic derivative of a transition metal.

Typical organic polymeric materials contemplated include organic polymers (and copolymers) especially polyethylene, polypropylene, poly(1-butene), poly(4- methyl-1-pentene), ethylenepropylene copolymers, ethylene-1-butene copolymers, ethylene-1-hexene copolymers, ethylene-vinyl acetate copolymers, ethyleneethyl acrylate copolymers, ethylene-acrylic acid copolymers and their salts, polystyrene, polyvinyl chloride, poly(vinylidene chloride), polyvinyl fluoride, poly(vinylidene fluoride), polyoxymethylene, poly(ethylene oxide), poly(propylene oxide), polyvinyl alcohol, polyvinyl acetate, polyvinyl formal, polyvinyl butyral, poly(methyl acrylate), poly(ethyl acrylate), poly(caprolactam), poly(hexamethylenedipamide), poly(ethylene terephthalate), vinyl chloride-vinyl acetate copolymers, acrylonitrile polymers and copolymers, methacrylonitrile polymers and copolymers, cellulose acetate, cellulose propionate, cellulose acetate butyrate, ethyl cellulose, methyl cellulose, hydroxyethyl cellulose, and hydroxypropyl cellulose. Preferred polymers include polyethylene, polypropylene, poly(1-butene), poly(4-methyl-1-pentene), polystyrene and polyvinylchloride.

The phrase "organic photosensitizer", as used herein, may be defined as an organic substance which absorbs ultraviolet or visible light, and which upon photo-excitation is capable of initiating a chemical reaction such as photo-oxidation, photo-polymerization, photo-isomerization, etc.

Suitable organic photosensitizers include ketones such as acetophenone, acetoin, 1'-acetonaphthone, 2'-acetonaphthone, anisoin, anthrone, bianthrone, benzil, benzoin, benzoin methyl ether, benzoin isopropyl ether, 1-decalone, 2-decalone, benzophenone, p-chlorobenzophenone, dibenzalacetone, benzoylacetone, benzylacetone, deoxybenzoin, 2,4-dimethylbenzophenone, 2,5-dimethylbenzophenone, 3,4-dimethylbenzophenone, 4-benzoylbiphenyl, butyrophenone, 9-fluorenone, 4,4'-bis-(dimethylamino)-benzophenone, 4-dimethylaminobenzophenone, dibenzyl ketone, 4-methylbenzophenone, propiophenone, benzanthrone, 1-tetralone, 2-tetralone, valerophenone, 4-nitrobenzophenone, di-n-hexyl ketone, isophorone, chalcone, 4,4''-oxydibenzophenone, 10-thioxanthenone, xanthone; quinones such as anthraquinone, 1-aminoanthraquinone, 2-aminoanthraquinone, 1-chloroanthraquinone, 2-chloroanthraquinone, 1-methyl-anthraquinone, 2-methylanthraquinone, 2-ethylanthraquinone, 2-tert-butylanthraquinone, 1-nitroanthraquinone, 2-phenylanthraquinone, 1,2-naphthoquinone, 1,4-naphthoquinone, 2-methyl-1,4-naphthoquinone, 1,2-benzanthraquinone, 2,3-benzanthraquinone, and phenanthrenequinone; nitro compounds such as nitrobenzene, p-nitroanisole, 4-nitrobiphenyl, and p-nitroaniline; organic sulfur compounds such as diphenyl disulfide, dibenzyl disulfide, dibenzoyl disulfide, tetramethylthiuram monosulfide, tetramethylthiuram disulfide, 2-mercaptobenzothiazole, and p-toluenesulfinic acid; halogenated organic compounds, such as chlorinated paraffins, chlorinated biphenyls and polyphenyls, chlorinated toluenes, chlorinated xylenes, benzal chloride, benzhydryl chloride, chlorinated naphthalenes, tetrachlorotetrahydronononaphthalene, phenacyl chloride, phenacyl bromide, and styrene dibromide; aromatic amines such as diphenylamine, triphenylamine, and N-phenyl-betanaphthylamine; organic peroxides and hydroperoxides such as tert-butyl hydroperoxide, cumene hydroperoxide, p-menthanehydroperoxide, tert-butylperoxybenzoate, dicumylperoxide, and 2,4-dimethyl-2,5-bis(tert-butylperoxy)hexane; and azo compounds such as azobisisobutyronitrile, azodicarbonamide, dimethyl-2-azobisisobutyrate, and azobenzene.

Organic dyes may also be employed as organic photosensitizers. Typical examples include Acridine Orange, Acridine Yellow, Alizarin, Azure B, Brilliant Green, Bromthymol Blue, chlorazole Black E, Congo Red, Crystal Violet, N,N-Dimethyl-p-phenylazoaniline, Eosin Y, Fluorescein, Indigo, Malachite Green, Martius Yellow, Methylene Blue, Methylene Violet, Methyl Orange, Methyl Red, Orange II, Pararosaniline, Rhodamine B, Rose Bengal, and Solvent Violet 9.

Preferred organic sensitizers include benzophenone, chalcone, 4,4''-oxydibenzophenone, 10-thioxanthenone, xanthone, 2-methylanthraquinone, 2-ethylanthraquinone, and 2-tert-butylanthraquinone.

The term "transition metal" as used herein, should be understood to include elements 21 through 30, 30 through 48, 57 through 80 and 89 through 103 of the Periodic Table. In chemical terms, these are elements having a partially filled inner shell of electrons. Preferred transition metals are cobalt, chromium, copper, iron, manganese, and nickel.

The phrase "organic derivative", when applied to the transition-metal-containing component of the additive, should be understood to include all compounds and mixtures thereof, having a structure which contains at least one transition-metal atom and at least one organic group. The term is intended to include both chelates and salts of organic acids.

Specific organic derivatives of transition metals, which may be employed in the practice of this invention, include naphthenates, octoates, oleates, tallates, linoleates, resinates, 3,5,5-trimethylhexoates, neodecanoates, acetates, butyrates, valerates, laurates, myristates, palmitates, stearates, cyclohexanebutyrates, dialkyldithiocarbamates, acetylacetonates, benzoylacetonates, dodecylacetylacetonates, oxalates, citrates, tartrates, disalicylalethylenediamine chelates, and phythalocyanines, all derived from the following elements: cobalt, chromium, copper, iron, nickel, and manganese. The metal may be in any valence state for which the corresponding organic derivative is obtainable: for example, cobalt may be present in the cobaltous or cobaltic state, copper in the cuprous or cupric state, and iron in the ferrous or ferric state.

Preferred organic derivatives of transition metals include ferrous octoate, ferrous stearate, ferric octoate, ferric stearate, ferric dimethyldithiocarbamate, and ferric di-n-butyldithiocarbamate.

The novel plastic compositions of this invention are prepared by a number of methods. A preferred method consists essentially of heating the polymer at a temperature below its decomposition temperature, incorporating the photosensitizer and transition-metal derivative, and mixing the ingredients so as to obtain a substantially uniform mixture. The mixture can then be molded and cooled to form a solid molded article. In the alternative, the mixture can be extruded and cooled to form a solid extrudate. Conventional plastic processing equipment can be used for melting the polymer, mixing the polymer with the photosensitizer and autoxidizable substance(s) and molding or extruding the resulting mixture. Processing conditions, such as temperature, time, and pressure, will be obvious to those skilled in the art.

Another preferred process for preparing the novel plastic compositions of this invention consists essentially of blending the photosensitizer and transition-metal derivative with a solid polymer to obtain a substantially uniform mixture. The polymer is preferably in the form of pellets, granules or powder. Conventional plastic processing equipment can be used in the blending operation. The processing conditions will be obvious to those skilled in the art. The resulting mixture can be melted at a temperature below the decomposition temperature of the polymer and additives. The resulting melt can be extruded or molded and cooled to form a solid extrudate or molded article.

A preferred process for preparing the novel plastic compositions of this invention consists essentially of casting a film from a composition of the photosensitizer, transition-metal derivative, and polymer in an inert solvent or dispersant. By "inert solvent" is meant that the solvent does not react with the polymer, photosensitizer, or transition-metal derivative. Use of this method is particularly attractive for preparing degradable coating or adhesive materials.

The photosensitizer and/or transition-metal derivative can also be applied as a solution, slurry, or paste to the surface of a plastic article. Such surface application can comprise brushing, roller coating, spraying, dipping or printing (i.e., uniformly or image-wise) on the surface of the article, in the presence or absence of a solvent. If desired, such surface application can be followed by heating, in order to promote diffusion of the additive(s) into the plastic.

The novel plastic compositions of this invention can be prepared at the time of disposal of conventional plastic articles. For example, a plastic article can be crushed, milled or ground, and subsequently or simultaneously mixed with the photosensitizer and transition-metal derivative.

The novel degradable plastic compositions can also contain non-reactive additives. By the term "non-reactive additive(s)" is meant a chemical additive, filler, or reinforcement commonly used in the formulation of plastic compositions which does not materially interfere with the degradation process. For example, the compositions of this invention can contain processing aids, viscosity depressants, mold-release agents, emulsifiers, slip agents, anti-static agents, and fibrous reinforcements which do not materially detract from the eventual degradation of the composition. The compositions of this invention can also contain fillers, such as barium sulphate, calcium carbonate, calcium silicate, fumed colloidal silica, glass, and clay.

Flame retardants, lubricants, colorants, plasticizers, adhesion promoters and stabilizers, such as those used to prevent thermo-oxidative decomposition can also be used. In some cases, it may be necessary to add an antioxidant or stabilizer to permit high temperature processing, even though such additive may slow the degradation process. In other cases, it may be desirable to retard degradation for a limited period of time.

It is contemplated that the degradable plastic compositions of this invention will ordinarily contain about 0.01 to 10% by weight of the organic photosensitizer, about 0.001 to 5.0% by weight of the organic derivative of a transition metal, and about 85 to 99.99% by weight of the organic polymeric material. The quantities of any non-reactive additives should not be included in calculating such percentages.

In one preferred embodiment of the present invention, a mixture of an organic polymer, organic photosensitizer, and organic derivative of a transition metal is prepared and shaped by conventional means. The resulting film, sheet, fiber, tube, or molded article is then exposed to an artificial source of ultraviolet radiation, such as a mercury-vapor lamp. The function of this exposure is to initiate a gradual chemical degradation process and/or to convert the degradable polymeric composition to a more readily degradable material by the selective introduction of functional groups, such as hydroperoxide groups, which are capable of promoting further oxidative and/or photo-oxidative degradation processes. This exposure to an artificial source of ultraviolet radiation can be carried out immediately after fabrication of plastic bodies, or it may be conducted as part of a waste treatment process.

The following examples represent some of the best embodiments contemplated by the inventors.

EXAMPLE 1

A film of unstabilized polyethylene containing 0.05% by weight of 2-ethylanthraquinone and 0.05% by weight of ferric dibutyldithiocarbamate is prepared by casting from hot xylene onto a heated glass substrate. The resulting film, thickness 0.003 inch, is exposed in air for 11 days to Pyrex-filtered radiation from a UV source consisting of two 40-watt tubular lamps mounted in a reflector; the lamps exhibit peak emission at a wavelength of 310 millimicrons. The degree of photo-oxidation is then ascertained by measurement of the intensity of the carbonyl peak at ca. 1720 $cm^{-1}$ in the infrared spectrum; a substantial carbonyl peak, absorbance 0.445 units, is observed. When a film of additive-free polyethylene is prepared and exposed under the same conditions, the increase in absorbance in the carbonyl region is only 0.005 units.

EXAMPLE 2

Polyethylene films containing 2-ethylanthraquinone and/or ferric octoate are prepared in the manner described in EXAMPLE 1, and subjected to ultraviolet exposure for 5 days under the same filtered source. Infrared examination of the resulting films yields the results indicated in the following TABLE I:

TABLE I

| Additive | Carbonyl Absorbance After 5-Day Exposure |
| --- | --- |
| 0.10% 2-ethyl-anthraquinone | 0.005 |
| 0.01% Fe octoate | 0.010 |
| 0.10% 2-ethylanthraquinone plus 0.01% Fe octoate | 0.025 |

EXAMPLE 3

Polyethylene films containing 2-ethylanthraquinone and/or ferric dibutyldithiocarbamate are prepared in the manner described in EXAMPLE 1, and exposed to the same filtered ultraviolet source for 1 day and 5 day periods. Infrared examination of the resulting films yields the results indicated in the following TABLE II:

TABLE II

| Additive | Carbonyl Absorbance After 1-Day Exposure | Carbonyl Absorbance After 5-Day Exposure |
| --- | --- | --- |
| 0.10% 2-ethyl-anthraquinone | 0.005 | 0.005 |
| 0.05% ferric dibutyldithio-carbamate | 0.000 | 0.010 |
| 0.10% 2-ethylanthraquinone plus 0.05% ferric dibutyldithiocarbamate | 0.025 | 0.085 |

EXAMPLE 4

A polyethylene film containing 0.10% 2-ethylanthraquinone and 0.05% ferric dibutyldithiocarbamate is prepared in the manner described in EXAMPLE 1. The film is exposed for 24 hours in air to filtered radiation from the source described in EXAMPLE 1; infrared examination indicates that the carbonyl absorbance has increased by 0.025 units during the irradation. The same film is then stored in the dark, in air, for an 84-day period; subsequent infrared examination indicates that the carbonyl absorbance has increased by an additional 0.010 unit during the storage period.

We claim:

1. As a composition of matter, an organic polymeric material containing a degradation-controlling amount of an additive system consisting essentially of at least one organic photosensitizer selected from the group consisting of anthraquinone, 1-aminoanthraquinone, 2-aminoanthraquinone, 1-chloroanthraquinone, 2-chloroanthraquinone, 1-methyl anthraquinone, 2-methyl anthraquinone, 2-ethyl anthraquinone, 2-tert-butyl anthraquinone, 1-nitroanthraquinone, 2-phenylanthraquinone, 1,2-naphthoquinone, 1,4-naphthoquinone, 2-methyl-1,4-naphthoquinone, 1,2-benzanthraquinone, 2,3-benzanthraquinone and phenanthrenequinone and at least one transition metal dialkyldithiocarbamate.

2. The composition of claim 1 wherein the transition metal is selected from the group consisting of cobalt, chromium, copper, iron, manganese and nickel.

3. The composition of claim 2 wherein the transition metal dialkyldithiocarbamate is selected from the group consisting of ferric dimethyldithiocarbamate and ferric di-n-butyldithiocarbamate.

4. The composition of claim 1 wherein the polymeric material is selected from the group consisting of polyethylene, polypropylene, poly(1-butene), poly (4-methyl-1-pentene), polystyrene and polyvinylchloride.

5. A process for preparing a degradable polymeric composition which comprises incorporating into a polymeric material a degradation-controlling amount of an additive system consisting essentially of at least one organic photosensitizer selected from the group consisting of anthraquinone, 1-aminoanthraquinone, 2-aminoanthraquinone, 1-chloroanthraquinone, 2-chloroanthraquinone, 1-methyl anthraquinone, 2-methyl anthraquinone, 2-ethyl anthraquinone, 2-tert-butyl anthraquinone, 1-nitroanthraquinone, 2-phenylanthraquinone, 1,2-naphthoquinone, 1,4-naphthoquinone, 2-methyl-1,4-naphthoquinone, 1,2-benzanthraquinone, 2,3-benzanthraquinone and phenanthrenequinone and at least one transition metal dialkyldithiocarbamate.

6. The process of claim 5 wherein the transition metal is selected from the group consisting of cobalt, chromium, copper, iron, manganese and nickel.

7. The process of claim 6 wherein the transition metal dialkyldithiocarbamate is selected from the group consisting of ferric dimethyldithiocarbamate and ferric di-n-butyldithiocarbamate.

8. The process of claim 5 wherein the polymeric material is selected from the group consisting of polyethylene, polypropylene, poly(1-butene), poly(4-methyl-1-pentene), poly-styrene and polyvinylchloride.

* * * * *